United States Patent [19]

Hirose et al.

[11] Patent Number: 4,926,791
[45] Date of Patent: May 22, 1990

[54] MICROWAVE PLASMA APPARATUS EMPLOYING HELMHOLTZ COILS AND IOFFE BARS

[75] Inventors: Naoki Hirose; Takashi Inujima; Toru Takayama, all of Atsugi, Japan

[73] Assignee: Semiconductor Energy Laboratory Co., Ltd., Atsugi, Japan

[21] Appl. No.: 186,219

[22] Filed: Apr. 26, 1988

[30] Foreign Application Priority Data

Apr. 27, 1987 [JP] Japan ................................. 62-104024
Apr. 27, 1987 [JP] Japan ................................. 62-104025

[51] Int. Cl.⁵ ............................................ C23C 16/00
[52] U.S. Cl. ...................................... 118/723; 427/39; 427/45.1; 118/715; 156/345
[58] Field of Search ................. 118/715, 723; 427/47, 427/45.1, 39; 156/345, 643

[56] References Cited

U.S. PATENT DOCUMENTS 4,125,431 11/1978 Fowler ................................. 376/140
4,727,293 2/1988 Asmussen et al. .............. 315/111.41

FOREIGN PATENT DOCUMENTS 0209469 1/1987 European Pat. Off. .
0213377 9/1986 Japan .
0030891 2/1987 Japan .

OTHER PUBLICATIONS

"ECR Type Ion Source", Proc. 10th Symp. on ISIAT '86. (Tokyo 1986), pp. 117-120 by M. Tamba, Y. Ishibe and Y. Sakamoto.
"An Optimum Condition of Multipole Field for an ECR-Type Ion Source", Jap. Journal of Appl. Phys., vol. 25, No. 9, Sep. 1986 by Ishii et al., pp. L712-L715.
"Suppression of Noise in a Discharge Tube by a Minimum-B Type Magnet", Jap. Journal of Appl. Phys., vol. 27, No. 2, Feb. 1988, by Hiroshi Amemiya, pp. 297-301.

Primary Examiner—Norman Morgenstern
Assistant Examiner—Margaret Bueker
Attorney, Agent, or Firm—Sixbey, Friedman, Leedom & Ferguson

[57] ABSTRACT

A plasma processing apparatus and method is equipped with a vacuum chamber, helmholtz coils, a microwave generator and gas feeding systems. An auxiliary magnet is further provided in order to strengthen the magnetic field in the vacuum chamber to produce centrifugal drifting force which confine the plasma gas about the center position of the vacuum chamber.

5 Claims, 6 Drawing Sheets

MICROWAVE PLASMA APPARATUS EMPLOYING HELMHOLTZ COILS AND IOFFE BARS

BACKGROUND OF THE INVENTION

This invention relates to a plasma processing apparatus and method.

There have been known the ECR CVD for depositing thin films on a substrate. In this deposition method, a substrate may be placed in a vacuum chamber apart from the resonating space and a thin film such as an amorphous film is formed on the substrate by virtue of a divergent magnetic field induced in the vacuum chamber.

The ECR CVD can be performed in combination with other known deposition methods such as heated filament CVD, chemical transportation method, plasma CVD making use of a high frequency power at 13.56 MHz, microwave-assisted CVD. In accordance with this method, a reactive gas is confined and excited by supplying a microwave under a magnetic field in accordance with the electron cycrotron resonance. The excited reactive gas is drifted to a substrate which is located at a position remote from the resonating space. At the remote position, the excited gas is deposited on the substrate or attacks to the substrate to effected anisotropic etching. The pressure in the chamber during process has been maintained at a relatively low pressure, e.g. of the order of $10^{-4}$ Torr. Because of this, it is very difficult to form a highly crystallized film such as a diamond film and to choose the process condition with a broad flexibility.

SUMMARY OF THE INVENTION

It is therefore an object of the invention to provide a plasma processing apparatus and method in which a highly energized plasma gas is confined about the center position at which a substrate to be processed is disposed.

It is therefore an object of the invention to provide a plasma processing apparatus and method in which highly crystallized films can be deposited under flexible condition.

According to one aspect of the invention, an auxiliary magnet is provided in addition to a main magnet which produces a magnetic field parallel with the microwave propagating direction allowing the plasma gas to resonating with the microwave. The auxiliary magnet is located along the wall of the reaction chamber for the purpose of enhancing the strength of magnetic field at the periphery of the reaction chamber. Since charged particles are subjected to a drifting force proportional to the minus of the gradient of the absolute strength of the magnetic field, plasma gas is confined in the center by virtue of the additional magnetic field induced by the auxiliary magnet.

The resonance taking place in the reaction chamber includes the electron cycrotron resonance, the whistler mode resonace, or other type resonance which is caused by supplying a microwave under a magnetic field such as the mixed cyclotron resonance. By virtue of such a resonance, a highly energized plasma gas having its high density is obtained. In case of carbon deposition, a highly energized plasma produces a large amount of excited carbon atoms and the high reproducibility is achieved.

In accordance with the most broad concept, it is noted that the present invention is also effective in case of thermal CVD, photo-assisted CVD or so forth in which no magnetic field is utilized. The reactive gas is confined in the vicinity where deposition is desired in the other deposition systems.

BRIEF DESCRIPTION OF THE INVENTION

FIG. 1 is a schematic diagram showing a plasma processing apparatus for in accordance with the present invention.

FIGS. 2(A) and 2(B) are a cross sectional view and a side elevation view showing Ioffe bars for use in accordance with the present invention.

Figure 6A:
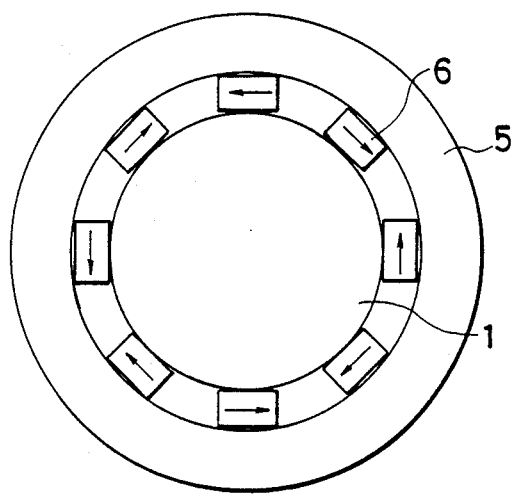
Figure 6B:
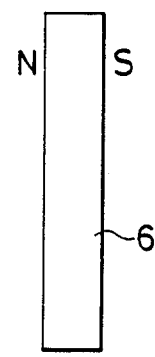

FIGS. 6(A) and 6(B) are a cross sectional view and a side elevation view showing Ioffe bars another type for use in accordance with the present invention.

Figure 7:
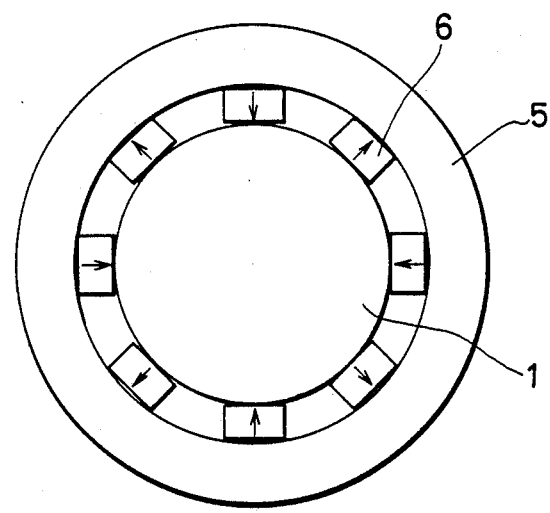

FIG. 7 is a cross-sectional view Ioffe bars a further type for use in accordance with the present invention.

DETAILED DESCRIPTION OF THE PREFERRED EMBODIMENTS

Figure 1:
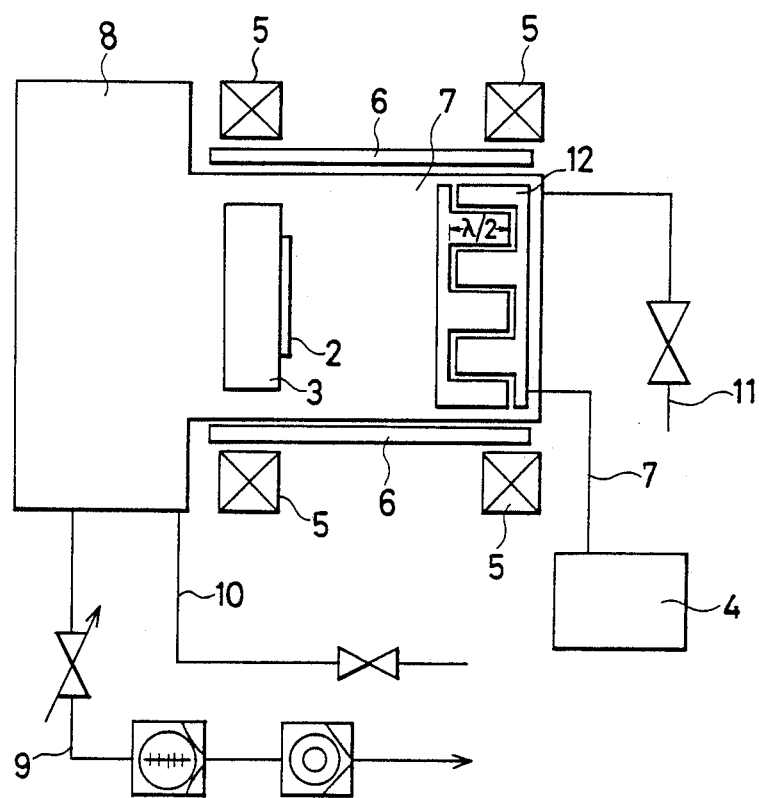

Referring to FIG. 1, a microwave assisted plasma-CVD apparatus in accordance with the present invention is illustrated. In the figure, the apparatus comprises a reaction vacuum chamber 1 defining a resonating space therein, a loading chamber 8 connected with the vacuum chamber 1, a substrate holder 3 capable of carrying a substrate 2 to be treated, helmholts coils 5 around the reaction chamber 1, an auxiliary electromagneto 6 located inside of the helmholtz coils around the reaction chamber, a microwave generator 4 connected to the reaction chamber 1 through a waveguide 7, an evacuating system 9, and gas feeding systems 10 and 11. The holder 3 is made of a highly thermal conductive material, such as aluminum nitride, which less disturb the microwave transmission from a microwave introduction window 12.

Figure 2A:
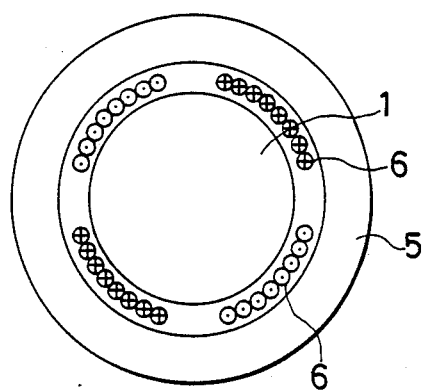
Figure 2B:
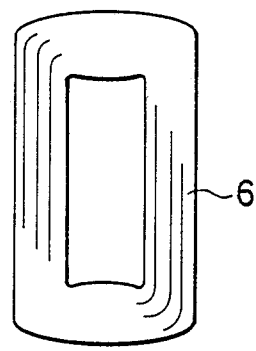
Figure 3:
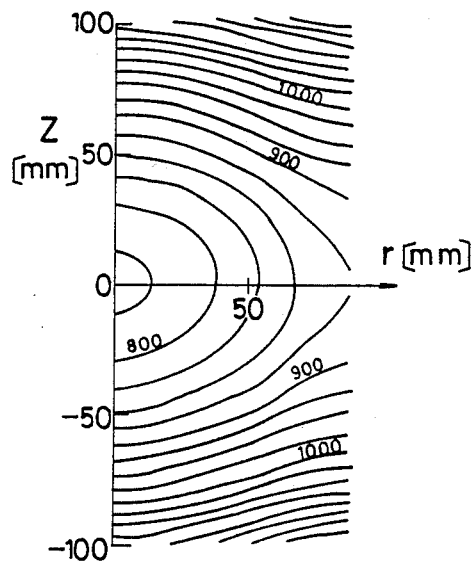
FIG. 3 is a graphical diagram showing the strength of magnetic field in a reaction chamber in accordance with the present invention.
Figure 4:
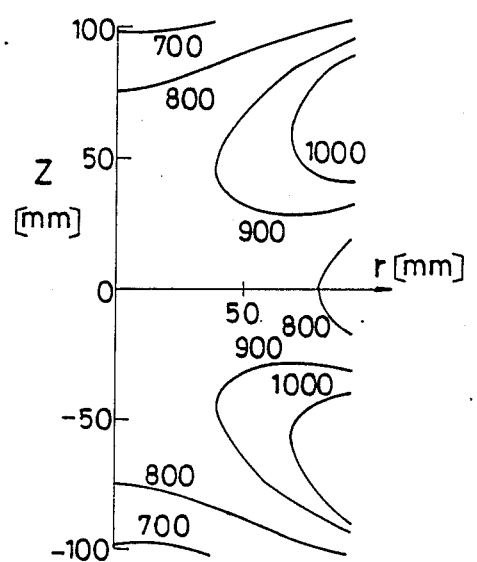
FIG. 4 is a graphical diagram showing the strength of magnetic field induced only by helmholtz coils in a reaction chamber.

The auxiliary magnet 6 consists of two electromagnetos providing Ioffe bars which extend in the direction of the microwave propagation (FIGS. 2(A) and 2(B)). In FIG. 2(A), the end marks of arrow denote the current passing direction of each bar. The object of the provision of the Ioffe bars is to strengthen the strength of magnetic field near the cylindrical wall of the reaction chamber 1. FIG. 3 is a graphical diagram showing the surfaces on each of which the strength of the magnetic field is constant. The abscissa is the distance (r) from the axis of the cylindrical reaction chamber and the ordinate is the axial distance from the center plane of the helmholtz coils 5. The figure given to each surface denotes the strength (Gauss) of the magnetic field on that surface. As shown in the diagram, the strength of the magnetic field takes a larger value at a nearer position to the cylindrical wall, so that the drifted force excerted on the plasma is alwalys centrifugal. The magnetic field is weakest on the axis of the cylindrical reaction chamber. FIG. 4 is a graphical diagram showing the surfaces on which the magnetic field is constant when the auxiliary magnet is not used.

Next, the deposition process with this apparatus will be described. A substrate 2 is mounted on the holder 3 and disposed at an appropriate position in the reaction chamber 1 where the microwave and the magnetic field sutisfy the ECR contition. After evacuating the reaction chamber 1, the substrate 2 is heated to 500° C. and hydrogen gas is leaked into the chamber 1 at 10 SCCM through the gas feeding system 11. The introduced hydrogen gas is energized into a plasma gas by virtue of a 2.45 microwave emitted from the generator 4 and a magnetic field induced by both the helmholtz coils 5 and the auxiliary magnet 6. The strength of the portion of the magnetic field that is induced by the coils 5 is about 2 K Gauss at the resonating space (a partion of the reaction chamber). The pressure in the resonating space is maintained at 0.1 Pascal. The surface of the substrate is cleaned by virtue of the plasma.

Then, the introduction of hydrogen is halted and a carbon compound gas such as $C_2H_2$ or $CH_4$ is introduced into the reaction chamber 1 and excited in the same way as hydrogen as explained above. By this process, a diamond or i-carbon film is deposited on the substrate which has been heated to about 500° C. According to experimental, diamond films were deposited particularly when the substrate temperatures were not higher than 650° C.

In accordance with the electron beam defraction analysis, a halo pattern was observed at a relative low temperature together with a spot pattern which is peculier to amorphous structures. Such an image indicates the presence of i-carbon. The halo pattern gradually distincted as the substrate temperature was elevated. When the substrate temperature was elevated higher than 650° C., the deposited film became composed mainly of diamond. The diamond film was confirmed by obtaining its Raman spectrum. The spectrum includes a moderate peak near 1500 $cm^{-1}$ and a sharp peak near 1333 $cm^{-1}$.

For reference, the same process was repeated without inducing a magnetic field in the reaction chamber. The film thus deposited was made of graphite. Even with the presence of magnetic field, no i-carbon film could not be deposited on a substrate at a temperature lower than 150° C.

The above process can be applied to a method of depositing polycrystalline silicon carbide films by making use of silicon carbide gaseous compounds as the reactive gas, to a method of depositing alminium nitride films by making use of a reactive gas consisting of an aluminium compound gas and ammonia, and a method of depositing films having a high melting point, e.g. films made of tungsten, titanium and molybdenum or their silicon compounds. In the same way, the present invention can be applied for the deposition of BN, CN, TiN and BP.

Figure 5:
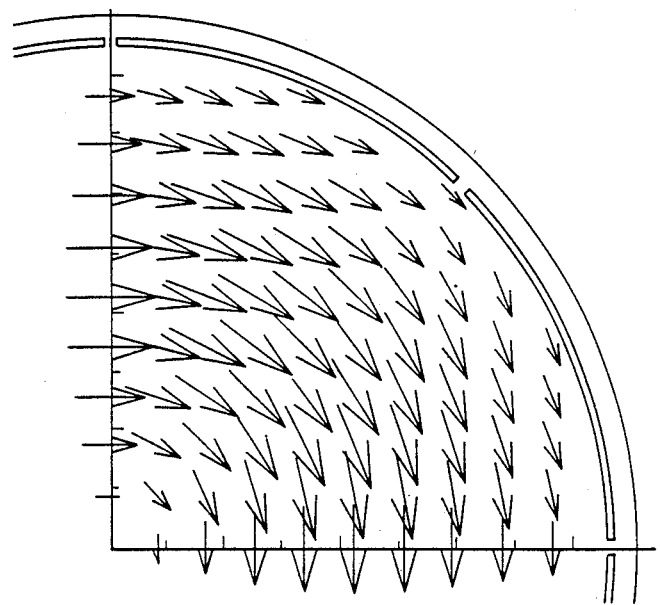
FIG. 5 is a schematic diagram showing another plasma processing apparatus for in accordance with the present invention.

FIG. 5 a schematic veiw showing another type of plasma processing apparatus. This apparatus is largely same as the above explained apparatus besides the relationship between the the helmholtz coils 5 and the connection position of the waveguide 7 to the reacion chamber 1. In the arrangement, it is very important that a microwave is mixed with a reactive gas only in the left side of the center surface C between the helmholtz coils 5, so that the reactive gas is subjected to the magnetic field that is monotonically decreases toward the left in the resonating space. The magnetic field functions to drift the plamsa gas to the substrate 2 and prevent the gas from producing deposition on the right side wall.

The Ioffe magnet may be another type magnet. FIGS. 6(A) and 6(B) are drafted in correspondence with FIGS. 2(A) and 2(B) to show another type of Ioffe magnet sutable for use in accordance with the invention. As shown in the figure, a plurality of rod-shaped permanent magnets are arranged immediately inside of the helmholtz coils 5 with their magnetic moments directed to the circumferential direction as indicated by arrows. The magnetic moments can be arraged in the axial direction as shown in FIG. 7.

While a description has been made for several embodiments, the present invention should be limited only by the appended claims and should not be limited by the particular examles. What follow are some examples of modifications and variation according to the invention. By adding oxygen, water or the like to the reactive gas, the crystallinity of the deposited film can be enhanced. By irradiating the exciting plasma gas with ultraviolet rays between the resonating space and the substrate to be coated, the exciting plasma gas can hold its energy even substantially distant from the resonating space. For instance, a diamond or i-carbon film can be deposited on a large area. Also, by applying a DC bias voltage to the exciting plasma, a larger amount plasma reaches the substrate enabling a high deposition speed. Also, as easily understood by those skilled in the art, the present invention is effective when used for plasma etching, particularly by making use of ECR. The etchant gas is confined by virtue of the magnetic field in the same way as explanied above.

We claim:

1. A plasma deposition apparatus comprising:
   a vacuum chamber in which a deposition space is defined;
   a substrate holder provided in said deposition space for supporting a substrate to be coated;
   Helmholtz coils within which said deposition space is located;
   Ioffe bars arranged in parallel with the axial direction of said Helmholtz coils;
   a vacuum pump for evacuating said vacuum chamber;
   a gas feeding means for inputting a reactive gas to said deposition space; and
   an energy supplying means for initiating the deposition reaction of said reactive gas.

2. The apparatus of claim 1 where said Ioffe bars comprise a plurality of coils arranged around said deposition space.

3. The apparatus of claim 1 wherein said supplying means comprising a microwave generator for emitting a microwave into said vacuum chmaber and said Helmholtz coils inducing a magnetic field substantially parallel with the propagating direction of the magnetic field emitted from said generator.

4. The apparatus of claim 1 wherein said Ioffe bars are a plurality of permanent magnet rods, each having its magnetic moment along the circumferential direction of said helmholtz coils.

5. The apparatus of claim 4 wherein said the senses of the magnetic moments of the Ioffe bars are alternating.

* * * * *

UNITED STATES PATENT AND TRADEMARK OFFICE
CERTIFICATE OF CORRECTION

PATENT NO. : 4,926,791

DATED : May 22, 1990

INVENTOR(S) : Naoki HIROSE et al.

It is certified that error appears in the above-identified patent and that said Letters Patent is hereby corrected as shown below:

The drawings should be replaced with the following Figs. 1-7:

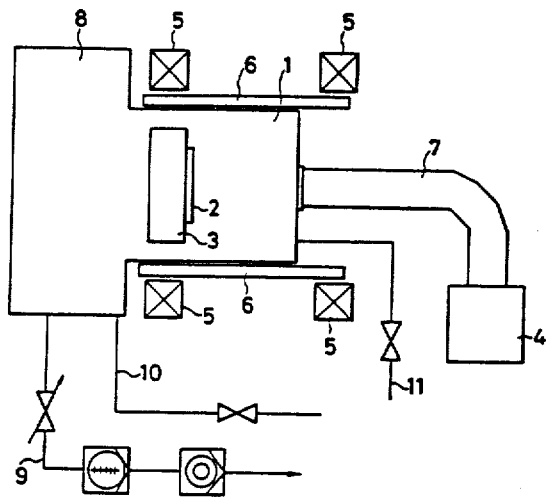

FIG.1

UNITED STATES PATENT AND TRADEMARK OFFICE
CERTIFICATE OF CORRECTION

PATENT NO. : 4,926,791

DATED : May 22, 1990

INVENTOR(S) : Naoki HIROSE et al.

It is certified that error appears in the above-identified patent and that said Letters Patent is hereby corrected as shown below:

FIG.2(A)

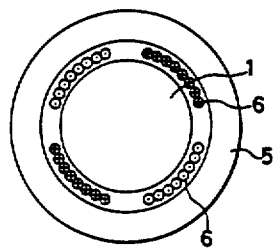

FIG.2(B)

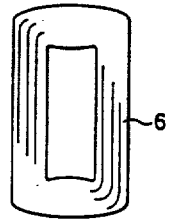

UNITED STATES PATENT AND TRADEMARK OFFICE
CERTIFICATE OF CORRECTION

PATENT NO. : 4,926,791

DATED : May 22, 1990

INVENTOR(S) : Naoki HIROSE et al.

It is certified that error appears in the above-identified patent and that said Letters Patent is hereby corrected as shown below:

FIG.3

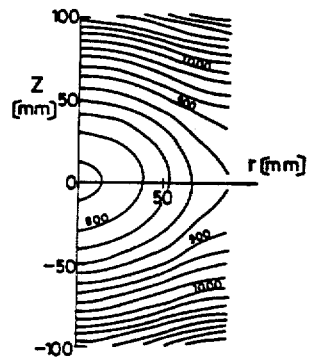

FIG.4

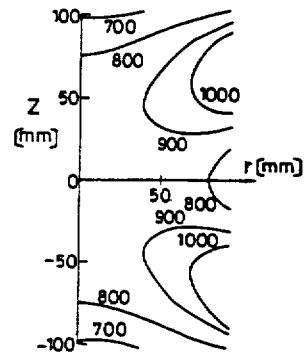

UNITED STATES PATENT AND TRADEMARK OFFICE
CERTIFICATE OF CORRECTION

PATENT NO. : 4,926,791

DATED : May 22, 1990

INVENTOR(S) : Naoki HIROSE et al.

It is certified that error appears in the above-identified patent and that said Letters Patent is hereby corrected as shown below:

FIG.5

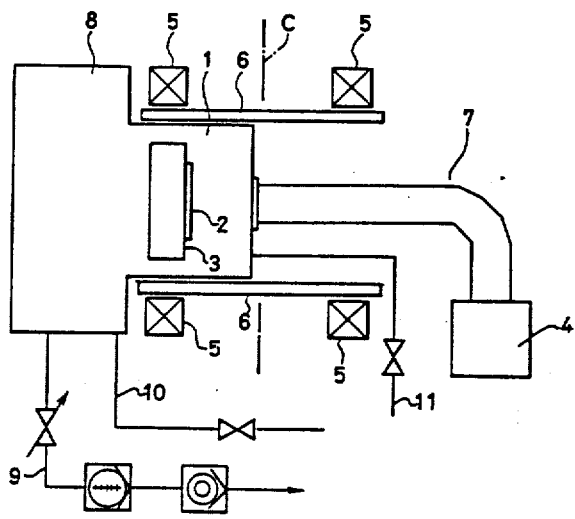

UNITED STATES PATENT AND TRADEMARK OFFICE
CERTIFICATE OF CORRECTION

PATENT NO. : 4,926,791

DATED : May 22, 1990

INVENTOR(S) : Naoki HIROSE et al.

It is certified that error appears in the above-identified patent and that said Letters Patent is hereby corrected as shown below:

FIG.6(A)

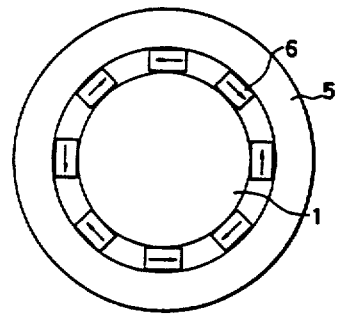

FIG.6(B)

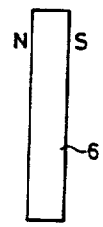

UNITED STATES PATENT AND TRADEMARK OFFICE
CERTIFICATE OF CORRECTION

PATENT NO. : 4,926,791

DATED : May 22, 1990

INVENTOR(S) : Naoki Hirose et al

It is certified that error appears in the above-identified patent and that said Letters Patent is hereby corrected as shown below:

FIG.7

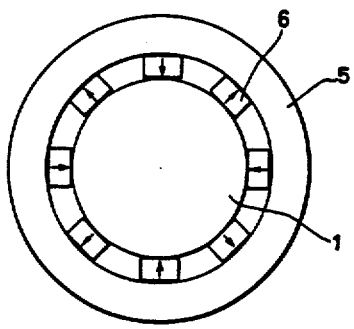

Signed and Sealed this

Fifteenth Day of December, 1992

Attest:

DOUGLAS B. COMER

Attesting Officer

Acting Commissioner of Patents and Trademarks